United States Patent [19]

McClean et al.

[11] 4,183,014
[45] Jan. 8, 1980

[54] ABSOLUTE ENCODING APPARATUS

[75] Inventors: William G. McClean, Milwaukee; Daniel C. Budge, Menomonee Falls, both of Wis.

[73] Assignee: Tri-N Associates, Inc., Milwaukee, Wis.

[21] Appl. No.: 760,938

[22] Filed: Jan. 21, 1977

[51] Int. Cl.² .................. G08C 19/28; G08C 9/06
[52] U.S. Cl. ..................... 340/204; 250/231 SE; 340/190; 340/347 P
[58] Field of Search ............ 340/347 P, 347 CC, 204, 340/203, 190, 206; 250/231 SE

[56] References Cited

U.S. PATENT DOCUMENTS

| | | | |
|---|---|---|---|
| 3,262,108 | 7/1966 | Schuman | 340/347 P |
| 3,276,010 | 9/1966 | Mountjoy | 340/347 CC |
| 3,668,690 | 6/1972 | Ormond | 340/347 CC |
| 3,705,400 | 12/1972 | Cordes | 340/347 P |
| 3,846,788 | 11/1974 | Calabro et al. | 340/204 |

Primary Examiner—John W. Caldwell, Sr.
Assistant Examiner—James J. Groody
Attorney, Agent, or Firm—Andrus, Sceales, Starke & Sawall

[57] ABSTRACT

First and second similar rotary encoders are interconnected such that the first encoder actuates the second encoder to advance one position for each half revolution of the first encoder. The first encoder is coupled to monitor the position of a rotary component. If the encoders are shifted or off-set by up to 90° to either side of precise zero crossover alignment, a logic comparator modifies the reading of the second encoder to create a true read-out. During each half revolution of the first encoder, the second encoder should read even or odd if a proper phasing exists. If the second encoder produces an opposite reading, a phase shift is indicated. A logic circuit, preferably a microprocessor is provided for combining and modifying the readout in accordance with the logic. A microprocessor includes a program to continuously sample the position of the successive encoders with an internal table applied to the position readouts to provide a correct and true value of the rotary component position.

9 Claims, 6 Drawing Figures

ABSOLUTE ENCODING APPARATUS

BACKGROUND OF THE INVENTION

This invention relates to cascaded absolute encoding apparatus and in particular to a programmed combining of phased encoders to increase the accuracy of the readout.

Digital controls and computing systems are widely employed in industry and related arts. Digital systems, of course, require conversion of analog-type data into digital form for incorporation into the logic and computing systems. Although conversion systems and devices are available, digital output transducers which produce a digital output in accordance with the phenomena being measured are preferably employed to minimize the complexity of the processing system, increase the accuracy, and the like. For example, rotary shaft encoders are widely employed to directly convert rotary and/or linear motion and position to a related digital signal output. A practical rotary absolute encoder may include a rotating element such as a disc mounted to the shaft and located to pass between an energy source and an energy detector. The disc is mounted with appropriately spaced energy opaque and transparent portions circumferentially arranged about the axis of rotation such that the output of the detector means is a series of pulse signals indicating the position of the shaft. By employing a plurality of detector means, the accuracy of the position can be detected within the accuracy of the smallest opaque portion of the least significant area. For example, in such a device a disc having a plurality of concentric tracks or rings, each of which includes equicircumferentially distributed adjacent light transparent and opaque sections or spaces may be coupled to a shaft with a light source mounted to one side of the disc and a photosensitive means mounted to the opposite side of the disc. The photosensitive means includes pick-up devices such as photocells oriented or aligned to separately respond to each of the concentric tracks. The successive tracks develop interrelated signals with the number of opaque sections and photosensitive devices increasing with the number of tracks. For example, a single photocell and a single track having two equal and opposite sections produces an indication of the shaft position within one half revolution. The use of two photocells requires two tracks of a similar 180° characteristic but off set by 90° and provides resolution within one quarter of the shaft position. A third track and photocell would require four sections and produce a resolution within one eighth. Additional tracks and photocells are similarly interconnected into the system to provide an increase in the reading of the shaft position. A ten channel encoder would thus provide a shaft indication within 1/1024 of a one shaft revolution. An absolute encoder employing a plurality of concentric rings generates a binary output, generally identified as a reflective or gray code, in which a single bit change occurs between any two successive position outputs. The output number is an exponent equal to the number of rings to the base two.

Well known electronic logic hardware is connected to the photosensitive devices to generate a numerical reading or output of the shaft position. Such encoders are employed for monitoring of machine position by suitable connecting of the encoder shaft to the appropriate machine shaft. The shaft can, of course, be coupled by the conventional gear, chain, pulley, or similar accurate drive positioning.

As the number of tracks and photocells increase the alternating opaque and transparent sections become successively smaller. As a practical matter there are limits on the size and therefore resolution which can be employed in any per unit of track length. Obviously the resolution can be increased by increasing the size of the disc or carrier. There are, of course, practical limits on such a development.

A further way of increasing the resolution or accuracy is to employ a plurality of cascaded encoders in such a manner that each successive encoder moves or advances a single bit for each complete revolution of the immediately preceeding encoder. This can be readily accomplished by the inter connection of the encoder shafts to each other through appropriate gears, sprockets, belts, chains or the like such that the corresponding rotational relationship is developed. Thus, by reading the position of the several encoders, the machine component position is determined to an accuracy related to the multiple of the position read-out of both encoders. For example, a pair of identical encoders each capable of indicating 1024 discreet positions when cascaded and properly interconnected, provides a read-out which is a multiple of the two, or 1,048,575 positions. Although such high resolution encoders can be constructed, the interconnection between them must be to a high degree of accuracy such that the several rotating discs simultaneously pass through the zero settings, or an errroneous reading results. As a practical matter, this requires the use of very special coupling systems and essentially eliminates the possibility of using commercially produced and relatively inexpensive production gears, belts, chains and other similar coupling devices. As a result, high resolution encoding apparatus is relatively expensive and even then such devices are not readily available. There is, therefore, a need for a simple, reliable and relatively inexpensive high resolution encoding apparatus.

SUMMARY OF THE INVENTION

The present invention is particularly directed to an interconnection of a plurality of encoders with a unique integrated phased digital output with a logic combining means to provide an accurate position readout even though the encoders are out of synchronism or preset positioning. Generally, in accordance with the present invention, a plurality of encoders are coupled for cascaded drive, wherein each complete cyclic movement of a first encoder causes a second encoder to move a predetermined substantial submultiple of a complete cycle. A logic readout means is connected to the plurality of encoders to produce a number equal to the sum of the individual readings. Successive encoders similarly are driven by a partial movement of the previous encoder. The successive cascaded encoder thus provides multiple readouts for each full revolution of the preceding encoder. The phase relationship between a decoder and a subsequent decoder is such that the readout of the second decoder may be increased or decreased by one to compensate for any phase shift in the alignment of the decoders. The logic readout means may be readily formed to make the logical and mathematical decision. Successive decoders may thus be offset in either direction by a predetermined amount related to the readout without affecting the accuracy of the readout.

In one embodiment, a first encoder generates a first series of timed, spaced, pulse signals per cycle of movement and a second encoder generates a second series of time-spaced pulse signals. The encoders are coupled such that the said second encoder generates a pulse signal for each plurality of pulse signals of the first encoder, when such plurality includes a whole submultiple of the total pulse signals per cycle of the first encoder such that the second series includes a fixed number of pulse signals per cycle of the first encoder independent of the phasing therebetween. The output of the second encoder is, therefore, related to said first series in time in accordance with the coupling and the reference or crossover positions of the encoders vary in phase relationship with any offset in the coupling. The phasing of the encoders establishes a fixed correction pattern for the second encoder readout which is based upon cyclical signal division of the second encoder relative to the first encoder. A logic circuit means is connected to the encoders for detecting the cyclical signal division of the second encoder relative to the first encoder and adds or subtracts a unit reading from said second encoder in accordance with any phase shift and related offset of the coupling. This maintains true reading by the second encoder of the movement of the first encoder means.

More particularly, in a practical and unique embodiment, first and second similar encoders are provided and interconnected such that the first encoder actuates the second encoder to advance one position for each half revolution of the first encoder or two advances for each complete revolution of the first encoder. The second encoder thus defines two distinct positions for each complete revolution of the first encoder which may be identified as even and odd position readings in accordance with decimal number readings of the second decoder. The first encoder may then be shifted or offset by 90° to either side of the precise zero crossover alignment with an appropriate logic comparison of the reading of the first and second encoders establishing modification of the readout of the second encoder to insure accurate readout. Thus, generally during each first half revolution of the first encoder the second encoder should read even if a proper or accurate phasing exists. If the second encoder produces an odd reading, the decoders are shifted from the normal in-phase relationship and one must be added during the first quarter cycle or subtracted during the second quarter of the first encoder movement from the second encoder readout depending on the direction of phase shift. During the second half of each revolution of the first encoder, the second encoder should produce an odd readout if the second encoder readout is proper. If it is even, however, a phase error exists and a one must be added or subtracted, with the one added during the one quarter cycle and a one subtracted during the opposite quarter cycle depending upon the direction of phase shift.

The phase relationship of the encoders may be monitored by any suitable logic means. In accordance with the further aspect of this invention, the multiple cascaded encoders have their individual outputs connected to a suitable computer and preferably a microprocessor for proper combining and modifying of the readout in accordance with a logic table. The microprocessor includes a program which is written to continuously sample the position of the successive encoders with the internal table applied to the position readouts to provide a corrected and true value of machine component position.

The total number of readout positions available is reduced by the factor of the subsequent or second encoder, but accuracy of readout is maintained without the requirement of specially designed and constructed couplings.

The present invention by allowing a relatively wide variance in the setting or the coupling of the encoders permits the use of commercial encoders with conventional and readily available coupling devices such as chains, brackets, gears, and the like. The present invention thus permits use of reliable and inexpense components which can be employed in industrial installations.

BRIEF DESCRIPTION OF DRAWINGS

The drawings furnished herewith illustrate a preferred construction of the present invention in which the above advantages and features are clearly disclosed as well as others which will be readily understood from the following description.

In the drawings.

DESCRIPTION OF ILLUSTRATED EMBODIMENT

Figure 1:
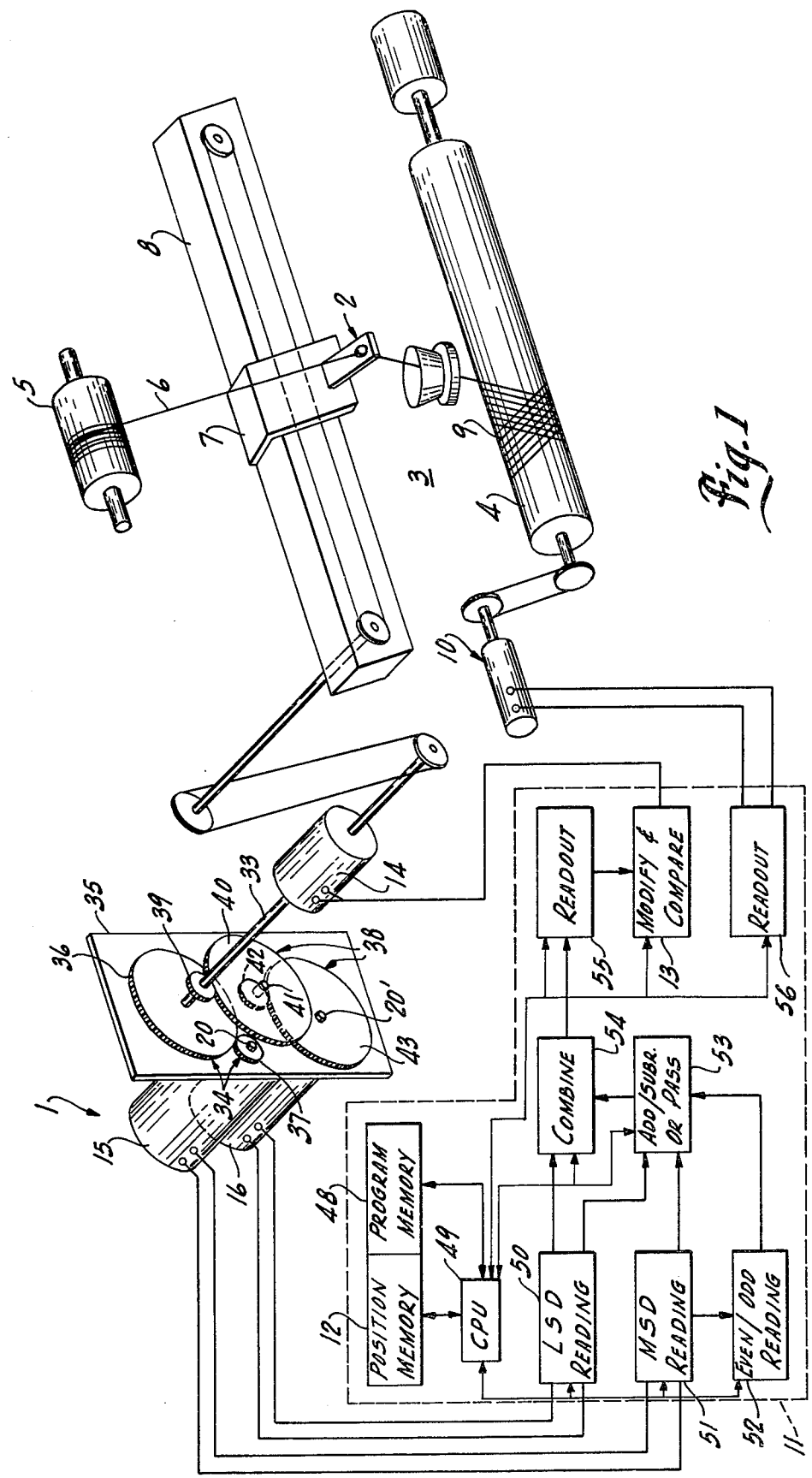
FIG. 1 is a pictorial view of a filament winding apparatus with an encoding apparatus constructed in accordance with the teaching of the present invention.

Referring to the drawings and particularly to FIG. 1, a digital encoding apparatus 1 constructed in accordance with the teaching of the present invention is shown connected to monitor the absolute position of a winding head 2 for a filament winding apparatus 3. A cylindrical mandrel 4 which is to be filament wound is rotatably mounted within the apparatus 3. One or more spools 5, of which only one is shown, of glass filament 6 provide a source of filaments which are fed through the head 2. The head 2 is mounted on a moving carriage 7. The rotation of the mandrel 3 draws the filament 6 from the corresponding spool 5 and the positioning carriage 7 moves along a track 8 which is parallel to the longitudinal axis of the mandrel 3. The relative movement of the mandrel 3 and positioning carriage 7 determines the angle of the helix formed about the mandrel 3. The article 9 is formed of multiple overlapping layers of the filament 6 which are formed by reciprocating the head 2 back and forth along the length of the mandrel 3, with each pass forming an additional filament layer. In the formation of the filament wound article the head 2 moves from an initial pre-set starting point and then moves in accordance with the rotation of the mandrel. In order to maintain such precise and desired accuracy, the rotation of the mandrel 3 can be detected by a suitable incremental encoder unit 10 providing a digital output related to the rotational of the mandrel. The position of the filament head 2 is detected by the absolute encoder unit 1. The outputs of the two encoder units 1 and 10 are compared and the position of the head 2 corrected if necessary. Although any suitable means can be employed, the present invention is particularly adapted to use of a microprocessor 11 to control the drive and positioning of the feed-head 2, as more fully developed in Applicants' copending application entitled FILAMENT WINDING APPARATUS, Ser. No. 760,937 filed on the same day herewith and assigned to a common assignee. As more fully developed therein, the microprocessor 11 includes a programmed memory 12 including a program written to calculate the proper position of the filament head 2 for each incremental movement of the mandrel 3. The microprocessor 11 includes an output driver unit 13 coupled to a servomotor 14 for positioning of the carriage 7. In operation, the microprocessor 11 continuously monitors and reads the output of the increments encoder unit 10 and then executes a selected program to determine the corresponding desired location of the head 2. The desired location is compared with the output of the absolute encoder unit 1 in an output routing and any deviation results in an appropriate output which actuates the servomotor 14 to reposition the carriage 7 and thereby establish the proper positioning.

The present invention is particularly directed to the construction of the absolute encoder unit and more particularly to the construction of a cascaded absolute encoder unit including a unique readout means to increase the accuracy of the readout while employing conventional interconnecting devices. Consequently, no further description of the filament winding apparatus or any other apparatus to which the absolute encoder unit might be applied is given other than as clearly necessary to explain in detail the illustrated embodiment of the invention.

Figure 2:
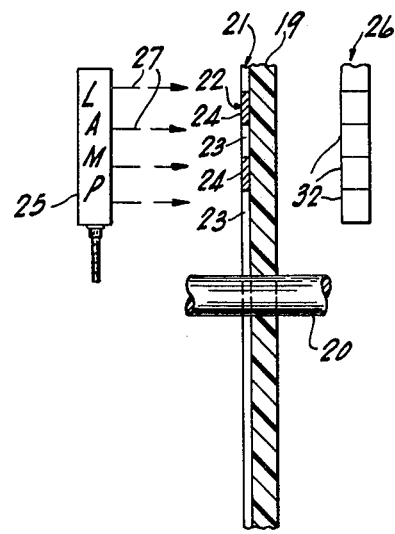
FIG. 2 is an enlarged view of a decoder unit shown in FIG. 1.

More particularly, referring to FIGS. 1 and 2, the absolute encoding unit 1 includes a first and second similar binary encoder 15 and 16 of a rotary construction and employing optical energy. Each of the encoders 15 and 16 is similarly constructed, with the first encoder 15 coupled to be driven by the carriage servomotor 14 and with the second encoder 16 coupled to be driven in relation with each complete revolution of the first encoder 15. The encoders 15 and 16 are coupled such that the second encoder 16 provides a readout related to the predetermined rotation of the first encoder 15, thereby expanding the number of numbered positions of the carriage 7 in its complete cyclical movement. This, of course, requires that the two encoders 15 and 16 are coupled with synchronized numbered advancing positions to eliminate any ambiguity in the readout. Thus, if the first encoder completes a revolution and the second encoder is retarded or advanced in phase, the second reading is either too large or too small at that time. The coupling of the second encoder 16 to the first encoder 15, as more fully developed hereinafter, is such that each complete revolution of the first encoder 15 generates an increase by two binary bits of the readout of the second encoder 16. This provides a plurality of fixed number of signals for each complete cycle of encoder 15 which have a distinct pattern if the two encoders are out-of-phase. The readout of the first and second encoders 15 and 16 are thus related binary numbers which when added define the absolute position of the carriage 7 relative to a zero or reference position. In FIG. 1, the microprocessor 11 is shown for a simple speed logic system or for purposes of clearly explaining the present invention.

In a preferred, practical construction the microprocessor 11 includes a program to read and combine the related outputs and thereby accurate read the position of the carriage 7 and therefore the filament winding head 2. The logic means is especially constructed or programmed to permit the coupling of the encoders 15 and 16 with the zero reading position offset or shifted in phase.

Generally, the logic means determines the relative reading of the second encoder 16 as to whether the latest bit is related to the first or second corresponding partial cycle for the previous complete revolution of the first encoder and then compares the phase position of the first encoder 15 to determine whether or not a modification of the second encoder readout is required to accurately reflect the relative movement of the two encoders and to compensate for any initial offset or phase shift between the two encoders 15 and 16.

Figure 3:
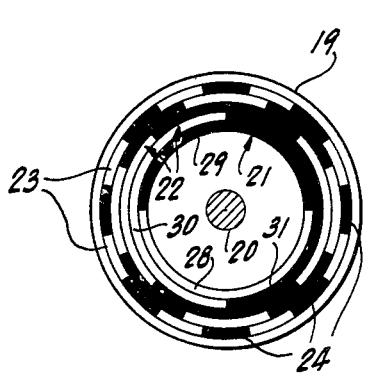
FIG. 3 is an enlarged elevational view of an encoder disc illustrated in FIG. 1 disclosing a transparent and opaque pattern for a plurality of channels establishing a gray scale encoding.

Referring particularly to FIGS. 2 and 3, the first encoder 15 includes a rotatable energy control member or disc 19 secured to an encoder shaft 20. The rotational motion or position of the shaft 20 is measured by photoelectric detection of a binary encoded pattern 21 on the disc 19. Generally, in the illustrated embodiment of the invention, a pattern of the disc 19 is shown with a conventional plurality of concentrically disposed tracks or rings 22, each of which comprises a predetermined and interrelated number of alternately transparent and opaque sections 23 and 24 with respect to the optical energy.

The disc 16 is mounted between an energy source 25 and an energy detection unit 26. The source 25 establishes a light or optical energy field 27 with the detection unit 26 correspondingly located to detect such field or energy.

Any other suitable fluid medium or field could, of course, be employed such as a magnetic field, an electric field, pneumatic field or the like.

The number of pairs of alternately transparent and opaque sections or areas 23 and 24 in each track 22 is varied in accordance with a particular pattern such that in combination an appropriate detectable output number is generated. For example, in a gray code disc, the number of transparent and opaque areas vary generally in succeeding adjacent sections by a geometric progression of 1, 2, 4, etc., beginning with the most significant binary number and proceeding into the larger number of pairs for the least significant binary information or number. In actual practice, the most significant track 22 may be located at the center of the disc pattern 21 and includes a single pair of optically transparent and opaque sections 28 and 29 which encompasses 180°. The next track 22 uses a similar number of sections 30 and 31, offset 90° from the first pair. The next track 22 includes two pairs, the next track four pairs and so forth, proceeding outwardly to the desired number accuracy. For example, in a practical system to produce a readout of 1024 for each revolution of the encoder shaft 21, ten concentric rings or tracks can be employed. A single elongated light source 25 can be located to the one side of the disc 19 to provide corresponding illumination of the disc along a radial line for energizing of each track 22. Individual or multiple light sources could, of course, be used. The photodetection means 26 includes individual photocells 32 located to the opposite side of the disc 19 and each is aligned with one track 22 to respond to the transparent and opaque aligned sections or pattern of the disc tracks 22. Thus, each of the photocells 32 provides a binary signal. The combination of the binary signals accurately defines the position of the encoder shaft 20, with the revolution equal to the segments in the outermost track 22. For example, in a ten channel encoder unit 11, the output of the photocells 32 provide the indication to the tenth power to the base 2 or 1/1024 units of each shaft revolution.

The shaft 20 of the first encoder 15 is coupled to the shaft 33 of the servomotor 14 by a suitable reduction gear train 34, as shown in FIG. 1. The encoders include an outer housing mounted to mounting plate 35, with the shaft 15 projecting through an appropriate bearing not shown, and located in parallel spaced relationship to the motor shaft 33. A spur gear 36 is secured to the motor shaft 33 by a suitable hub clamp and meshes with a relatively small gear 37 secured to the encoder shaft 20 of the first encoder 15.

The second encoder 16 is similarly constructed and corresponding elements are identified by corresponding primal numbers for simplicity of explanation. The second encoder 16 similarly includes a patterned disc 19' with the light source 25' on one side and the corresponding plurality of photocells 32' to the opposite side. The encoder 16 thus provides a corresponding plurality of binary signals which in combination provide a precise indication of the rotation of the second encoding disc 19'. The shaft 20 of the second encoder 16 is coupled to the input shaft 33 for related movement with the first encoder 15 by a suitable gear train 38.

A small gear 39 is secured to the motor shaft 33 and rotates therewith. Gear 39 meshes with a large idler gear 40, rotatably mounted by an idler shaft 41 rotatably supported to the mounting plate 35. A small gear 42 on the idler shaft 41 meshes with a relatively large gear 43 on the shaft 20' of the second encoder 16.

Each complete selected rotation of the servomotor shaft 33 a related rotation of the first and second encoders 15 and 16 occurs. For example, each selected movement of the motor 14 can through the increasing gear ratio result in a complete revolution of the first encoder 15, generating a binary output number that progressively increases by bits of one from 0 to 1,024.

The second encoder 16 which is driven through the gear train 38 is constructed such that for a corresponding rotational movement the encoder disc 19' moves to increase the number by two by advancing two single bits or steps. Thus, as the binary number output of the first encoder 15 changes from 1 to 1,024, the second encoder changes by two. The absolute output number is therefore the multiple of the actual movement of the first encoder 15 times the movement of the second encoder 16 divided by two. As noted previously, the encoders 15 and 16 are constructed to move in synchronism and in the absence of this invention would have to pass through a number in a precise preset reference position. Thus, the second encoder 16 must advance one for each complete revolution and must advance at the same precise time that the first encoder passes through zero.

For example, FIG. 3 of the drawings is a developed view of the outputs for encoding discs 19 and 19' in the assumed embodiment, with the movement of the first encoder 15 shown for a plurality of complete revolutions. In this developed view, the two discs 19 and 19' are assumed to start with the precise aligned zero or reference positions such that the second encoder 16 moves to a first output in synchronism with the first encoder 15 passing through the 512 number. The second encoder 16 provides a 2 output or reading in synchronism with the first encoder 15 completing one complete revolution and thus passing through the reading 1024, to begin a new cycle. During the second revolution of encoder 15, the second encoder 16 successively read 3 at the 512 output reading and 4 at the 1024 output reading of the first encoder 15, and so forth. Thus the output of the second encoder 16 is an accurate or true record and indication of the number of full revolutions of the first encoder 15. To get the total movement of the servomotor 14 and therefore carriage 7, the second reading is, of course, divided by two and multiplied by the gradation of the first encoder and then added to the first encoder.

If for any reason, however, the first and second encoders 15 and 16 are not in precise synchronism such that the second encoder advances is not exactly in phase with the zero or reference position of encoder 15, the output is ambigious and/or errorroneous. For example, if the second encoder 16 should advance shortly after the passing through zero of the first encoder, the absolute reading is in error for the period required for the second encoder to advance to record such completed revolution. If the second encoder 16 moves through zero shortly or slightly before the first encoder passes its zero position, a corresponding error in the phase relationship of the encoder elements exists for that portion of the rotation before the first encoder 15 reaches zero.

Figure 4:
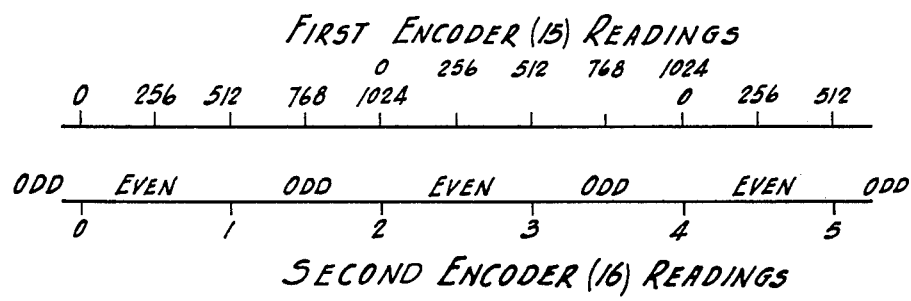
FIG. 4 is the developed view of the encoded readings of a pair of cascaded discs assuming precise alignment and synchronism of the zero crossing for the pair of the encoding disc.

In FIG. 4, the first encoder readings are shown at the four equally spaced portions or quadrants and the second encoder reading in the decimal numbering system is always an even number for the first two quadrants or half of the cyclical rotation of the encoder 15 and odd for the third and fourth quadrants or the second half of the cycle. This may be conveniently shown for FIG. 4 in the following table of results:

Table 1

| | Table of Results | |
|---|---|---|
| | Encoder 15 Readings | Encoder 16 Readings |
| 1st Quadrant | 0 to 256 | Even |
| 2nd Quadrant | 256 to 512 | Even |
| 3rd Quadrant | 512 to 768 | Odd |
| 4th Quadrant | 768 to 1024 | Odd |

This relationship changes in a unique manner with the change in the phase coupling of the encoders 15 and 16 and is employed to correct the readings of the second encoder 16 when necessary, to accurately record the rotation of the first encoder.

Figure 5:
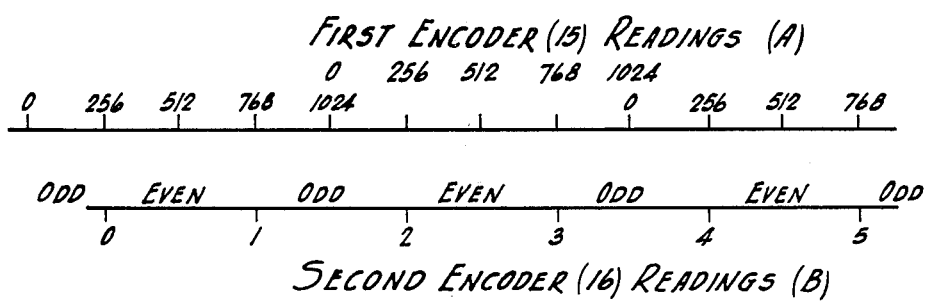
FIG. 5 is a view similar to FIG. 3 illustrating a 90° shift between the encoder discs.
Figure 6:
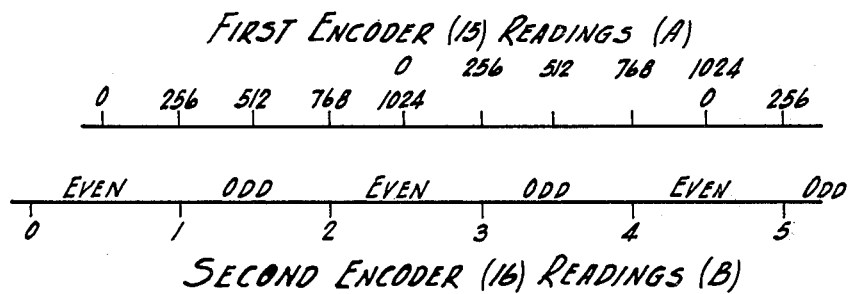
FIG. 6 is a view similar to FIG. 4 illustrating an opposite 90° shift of the encoder discs.

For example, referring to FIG. 5 it is assumed that the first encoder 15 and particularly disc 19 is shifted ahead 90° with respect to the second encoder 16 at or advanced by the zero reading position. When the first encoder 15 thus passes zero or 512, the one half cycle position, the second encoder 16 should provide an increased number or readout. The second encoder 16 does not do so as a result of the advance or phase shift by the first encoder 15 until 90° later, that is at the 768 and 256 readings.

As shown in FIG. 5, with the first encoder 15 shifted up to 90° in advance from the position of the second encoder 16, the reading of the second encoder 16 is correct or incorrect depending relative phase relationship between the several portions of each revolution of the first and second encoders.

For example, referring to FIG. 5 with the encoders 15 and 16 starting from zero position and with the 90° offset or advance of the first encoder, the two quarters of the first encoder cycle results in a proper output reading for both encoders, with the second reading being zero. The first encoder 15 produces an increasing output during the first and second quadrant at the end of which the output is 512. In accordance with the previous discussion, the second encoder 16 should have rotated sufficiently to align to generate a 1 output. However, as a result of the 90° or quadrant offset, the output of the second encoder remains at zero. Therefore one must be added to the reading of the second encoder to produce a proper readout. This can be readily done through the logic circuit 17 as herein after described.

From rotation of 512 to 768 the second encoder output is in error. At the 768 output of encoder 15, the encoder 16 is stopped and its output is increased by one to provide a one reading and properly reflect the completion of the previous half revolution of the first encoder 15. At point 768 the second encoder 16 is correct and one should no longer be added. From 768 to 1024, the second encoder 16 properly indicates that the first encoder 15 has gone through one half revolution plus some additional movement as recorded in encoder 15. At time 1024 of the first encoder 15 the second half of the cycle is completed and the second encoder 16 should move simultaneously with the first encoder to a 2 reading. However, as noted in FIG. 5 the output remains at one and again requires addition of the number one. This relationship continues to a readout of 256 of the first encoder 15, second revolution at which time the second encoder 16 properly moves to the number two readout and directly provices a proper output. This pattern continues to repeat as shown in FIG. 5 and can be set forth as in following the table 2 of results which indicates one is added during the first and third quadrants and subtracted in the second and fourth quadrants of each revolution of encoder 15:

Table 2

| | Table of Results | |
|---|---|---|
| Encoder (15) Readings | Encoder (16) Readings | Encoder (16) Correction For True Reading |
| 1st Quadrant | Odd | Add 1 |
| 2nd Quadrant | Even | -0- |
| 3rd Quadrant | Even | Add 1 |
| 4th Quadrant | Odd | -0- |

If the first encoder 15 is shifted retarded or phase shifted to the right with respect to the second encoder 16, a similar table results from a corresponding logical sequential relationship.

Thus, with the first encoder 15 retarded 90°, at the end of the first quadrant of rotation of encoder 15, the second encoder 16 generates a number one signal or read out. The read out of the second encoder 16 is, of course, properly still zero and one must be subtracted to correct the errroneous reading until the first encoder 15 has moved passed the digit 512. Consequently the logic must be set up to subtract during the period of rotation from 256 to 512. From 512 to 768 the encoder 16 properly reads 1 and no correction is to applied. At the 768 reading of the first encoder 15, the second encoder 16 because of the phase shift prematurely generates the number two reading. From 768 to 1024 therefore, one must be subtracted from the readout of the encoder 15. This same pattern continues to repeat with continued rotation and in table form, the results are as follows:

Table 3

| Encoder 15 Readings | Encoder 16 Readings | Encoder 16 Correction For True Reading |
|---|---|---|
| 1st Quadrant | Even | -0- |
| 2nd Quadrant | Odd | Subtract 1 |
| 3rd Quadrant | Odd | -0- |
| 4th Quadrant | Even | Subtract 1 |

The pattern for either relative shift in the phasing of the encoders is therefore is combination of the two previous tables and define the following set of rules for correction of the reading of the second encoder 16 depending upon whether the B is moving through the first or second half of a cycle of rotation with the first half identified as even and the second half is identified as odd in relationship to the corresponding even and odd decimal digits created with such a result of rotational completion.

Table 4

| Encoder 15 Readings | Encoder 16 is Even | Encoder 16 is Odd |
|---|---|---|
| | Correction to Encoder 16 | |
| 1st Quadrant | -0- | Add 1 |
| 2nd Quadrant | -0- | Subtract 1 |
| 3rd Quadrant | Add 1 | -0- |
| 4th Quadrant | Subtract 1 | -0- |

The same Table equally applies for any other angular displacement of less than 90° to the right or left of the precise zero passing.

The microprocessor 11 includes in its memory 12 a program in appropriate assigned addresses or location, as diagrammatically shown by the labeled block 48, which is readily written for reading of the positions of the first and second encoders 15 and 16, applying the rule of Table 4 in order to yield the correct and true value of the machine component position.

In a preferred embodiment employing a microprocessor the incremental encoder reading is employed to calculate the desired position based on a mathematical definition in a programmed routine and then an output routine is executed in which any difference in the defined and actual position is determined and appropriate drive modification signal generated. A separate routine would also be provided for execution of the comparison of the absolute encoder reading and modification as required. An encoder program listing by a P.C.S. assembler for an Intel 8080 for comparing and modification of the second encoder reading is attached hereto and will be readily understood by those in the art.

A program or system for determining the phasing and calculations is diagrammatically illustrated in FIG. 1 wherein the microprocessor 11 is shown with a central processing unit (CPU) 49 such as that of the usual microprocessor connected to memory to execute the appropriate programs in memory including the program in location or section 48 and to other computer data reduction and calculation elements. A suitable sampling is, of course, provided at an appropriate time in the overall program and the corresponding numbers of encoders 15 and 16 read, sampled and stored, for example, in suitable register 50 and 51 or the like. An even- /odd detector 52 is shown coupled to the output of the register 51 for the reading of the second encoder 16 and the output applied to control an add/subtract unit 53. The add/subtract unit 53 is also connected to the register 50 for encoder 15 to determine the number and, therefore, the quadrant of the encoder 15. The unit 53 operates to either add, subtract or pass the number of the second encoder 15 and 16, as shown by unit 54. As noted previously, the encoder 16 output is divided by 2 and the result multiplied by the number in the output of the first encoder and this result added to the readout of encoder 15 to provide an absolute output number related to the total number of revolutions of the servomotor 14. In FIG. 1, the output is shown in a readout unit 55.

In a practical application, the microprocessor 17 is programmed to employ the absolute readout to position the head 2 as previously noted and more fully described in the cross-referenced application. Generally, the microprocessor 11 includes a program stored in memory 48 which is executed by the CPU 49 to continuously sample the incremental encoder 10, as reflected in a readout unit 56. The CPU 49 then employs this number to calculate the predetermined optimum position corresponding to the number of encoder 10. The actual position number of the readout unit 55 is compared to the programmed number and unit 13 actuated to produce the required correction signal to the servomotor 14.

Although the present invention is particularly directed to the absolute encoder apparatus as previously noted, the illustrated embodiment has been incorporated in a practical filament winding apparatus with highly satisfactory results. As noted previously, the illustrated logic circuit is given to clearly explain the present invention. In a commercial construction the several registers and the like would be the standard components of microprocessors which are also employed in other phases of the computer operation. As such detail can be readily provided in accordance with known devices and programming techniques, no further description is given herein. Further, any other suitable digital readout and number comparing means can, of course, be employed within the teaching of this invention.

The present invention particularly provides a highly accurate and reliable cascaded encoding means employing conveniently mass produced components and thus permits a practical and commercial construction at a reasonable cost.

Various modes of carrying out of the invention are contemplated as being within the scope of the following claims, particularly pointing out and distinctly claiming the subject matter which is regarded as the invention.

We claim:

1. An absolute position encoding apparatus comprising a plurality of cascaded encoding elements having interrelated signal gradations and having a synchronized reference position defining an in-phase relationship to produce in-phase cyclical signals and said elements being relatively movable therefrom defining an unique phase relationship related to a phase shift direction of said elements, means coupling said elements to each other for producing each multiple stepped movement of a first element and sequential stepped movements of a second element whereby said second element generates a like plurality of signals for each cycle of movement of said first element; means to provide a reading output of the second encoding element, the gradations of said first cascaded encoding element create an even number of positions divisable by four to define quadrants, said means for coupling said elements moving said second element for one graduation for each half cycle movement of said first element; said unique phase relationship defining a change by a factor of one in the reading output of the second encoding element for predetermined quadrants of the first encoding element in accordance with the relative phase shift direction of said elements and defining no change in the absence of any phase shift.

2. The absolute position encoding apparatus of claim 1 wherein said first encoding element is divided into four equal quadrants, said second element is divided into first and second halves defined as alternating even and odd halves, said reading output of said second element being modified by a factor of one in accordance with the following logic table:

| 1st Element Quadrant | 2nd Element 1st Half | 2nd Element 2nd Half |
|---|---|---|
| 1st | 2nd Correct | Add 1 to 2nd |
| 2nd | 2nd Correct | Subtract 1 from 2nd |
| 3rd | Add 1 to 2nd | 2nd Correct |
| 4th | Subtract 1 from 2nd | 2nd Correct |

3. The apparatus of claim 2 including a microprocessor having a means for reading the position signals of said first and second elements and programmed for executing the comparison and calculation in accordance with said table.

4. The absolute position encoding apparatus of claim 3 wherein said cascaded encoding elements are discs having said signal gradations circumferentially distributed about the axis of the discs, said second element moving one gradation for each half cycle movement of said first element whereby said second element generates a pair of signals for each complete cycle of movement of said first element; the number of said signals of said first element being changed by one during different quadrants of said first element rotation in accordance with an out-of phase relationship of said elements and remaining unchanged with the proper phase relationship of said elements.

5. In an absolute encoding apparatus, comprising a first encoder having a first cyclically moving element for generating a first series of timed, spaced pulse signals per cycle of movement, a second encoder having a second cyclically moving element for generating a second series of time-spaced pulse signals, coupling means coupling said first and second encoder elements with a reference position and moving said second encoder element to generate a pulse signal for each plurality of pulse signals from said first encoder and generating successive pairs of pulse signals in response to movement of the first encoder, said second series being related to said first series in time in accordance with said coupling means whereby said reference positions of said elements vary in phase relationship with offset in the coupling means, each successive pair of pulse signals of said second encoder including a whole submultiple of the total pulse signals per cycle of the first encoder whereby the second series includes a fixed number of pulse signals per cycle independent of the phasing of said elements, a readout connected to said second encoder, said phasing of said encoders establishing a fixed correction pattern to the readout of the second encoder based upon cyclical signal division of the second encoder relative to the first encoder, and logic circuit means connected to said first and second encoder and including means for detecting said cyclical signal division of the second encoder element relative to the first encoder element and for selectively adding a unit reading to the readout of said second encoder in accordance with a first phase shift and related offset of said coupling means and for subtracting a unit reading from the readout of said second encoder in accordance with a second phase shift and related offset of said coupling means and remaining unchanged with the proper phase relationship of said elements to maintain true reading of the movement of the first encoder.

6. The encoding apparatus of claim 5 wherein each of the encoders includes a field energy source, each said element is a disc having a plurality of concentric tracks having alternate energy transparent and opaque sections, the number of sections in said tracks changing geometrically to define a reflective binary coding, and individual photo cells to the opposite side of the disc from said energy source.

7. In the absolute encoding apparatus of claim 5 wherein said encoders each include its cyclically moving element separating an energy source from an energy detector and having a plurality of energy-responsive portions distributed for alternate and cyclical coupling the source to the detector for generating the corresponding time-spaced pulse signals, each of the encoders being constructed to define a gray code output, said second encoder increasing its readout by one bit for each plurality of number bits of said first encoder, and said logic circuit means connected to said first and second encoders adding and subtracting one bit from the reading of said second encoder in accordance with said phase shift and offset of said coupling means to maintain the true reading of the movement of the first encoder.

8. The absolute encoding apparatus of claim 5 wherein each encoder includes a photo detector and an energy source and said element of each encoder is a rotating disc member including a plurality of alternate energy opaque and energy transmitting portions distributed circumferentially for alternate and cyclical coupling the source to said photo detector, said portions of said first encoder disc member including four equal quadrants for generating like series of time-spaced pulse signals, said second encoder disc member generating a pulse signal for each half cycle of said first encoder disc member and generating a pair of pulse signals for each complete revolution of the first encoder disc member, said pair of pulse signals being defined as including an even signal for the first half cycle and an odd signal for the second half cycle, and said logic circuit means connected to said first and second encoder and adding and subtracting a unit reading from said second encoder in accordance with the following logic table:

| 1st Element Quadrant | 2nd Element Even Reading | 2nd Element Odd Reading |
| --- | --- | --- |
| 1st | 2nd Correct | Add 1 to 2nd |
| 2nd | 2nd Correct | Subtract 1 from 2nd |
| 3rd | Add 1 to 2nd | 2nd Correct |
| 4th | Subtract 1 from 2nd | 2nd Correct |

9. In an absolute encoding apparatus comprising an energy source, a first encoder means having a relatively movable first encoder member including a plurality of energy-responsive portions distributed for alternate and cyclical coupling to the source for generating a first series of timed, spaced, pulse signals per cycle of movement; a second encoder means having a relatively movable second encoder member including a plurality of energy responsive portions distributed for alternate and cyclical coupling to said energy source for generating a second series of time-spaced pulse signals, coupling means coupling said first and second encoder means to move said second encoder means through a reference position in a selected in-phase relation to a corresponding reference position of the first encoder member to generate a pulse signal for each plurality of pulse signals from said first encoder means, said second series being related to said first series in time in accordance with coupling means whereby the phase relation of said reference positions of said elements varies with offset in the coupling means, each adjacent pair of pulse signals of said second encoder means including a whole and same multiple of the pulse signals per cycle of the first encoder means whereby the second series includes a fixed number of pulse signals per cycle independent of the phasing of said elements, and logic circuit means connected to said first and second encoder means and including means for detecting the signals of the second encoded member relative to the first encoder member and having means for selective addition and subtraction of a unit reading from said second encoder means in accordance with opposite phase shift of said members from an in-phase position and offset of said coupling means and maintaining said output of said encoder means in response to said in-phase position to maintain the true reading of the movement of the first encoder means.

* * * * *

UNITED STATES PATENT AND TRADEMARK OFFICE
CERTIFICATE OF CORRECTION

PATENT NO. : 4,183,014
DATED : January 8, 1980
INVENTOR(S) : William G. McClean & Daniel C. Budge It is certified that error appears in the above-identified patent and that said Letters Patent are hereby corrected as shown below:

| | | | |
|---|---|---|---|
| Column 6, | Line 1, | After "or" insert --- circuit ---; |
| Column 6, | Line 5, | After "thereby" cancel "accurate" and substitute therefore --- accurately ---; |
| Column 8, | Line 22, | After "and/or" cancel "erroroneous" and substitute therefore --- erroneous ---; |
| Column 9, | Line 17, | After "as" cancel "herein after" and substitute therefore --- hereinafter ---; |
| Column 9, | Line 36, | After "directly" cancel "provices" and substitute therefore --- provides ---; |

UNITED STATES PATENT AND TRADEMARK OFFICE
CERTIFICATE OF CORRECTION

PATENT NO. : 4,183,014
DATED : January 8, 1980
INVENTOR(S) : William G. McClean & Daniel C. Budge It is certified that error appears in the above—identified patent and that said Letters Patent are hereby corrected as shown below:

| Column | 9,  | Line | 61 | After "correct the" Cancel "erroroneous" and substitute therefore --- erroneous ---; |
| Column | 9,  | Line | 65 | After "is to" insert --- be ---; |
| Column | 10, | Line | 15 | After "therefore" cancel "is" and substitute therefore --- in ---; |
| Column | 11, | Line | 50 | After "out" cancel "of". |

Signed and Sealed this

Fifth Day of August 1980

[SEAL]

Attest:

SIDNEY A. DIAMOND

Attesting Officer

Commissioner of Patents and Trademarks